United States Patent
Paes et al.

[19]

[11] Patent Number: 6,068,009

[45] Date of Patent: *May 30, 2000

[54] FREE-STANDING, PORTABLE TENT ASSEMBLY WITH FLEXIBLE, ELECTRONIC SIGNAL SHIELDED ENCLOSURE

[76] Inventors: Ned Z. Paes, 6547 Quail Hollow Dr., Manassas, Va. 22111; Terry Phillips, 109 N. Thomas St., Bellefonte, Pa. 16823; Robert E. Thomas, 13809 Miken Ct., Manassas, Va. 22111; Joseph H. Aldridge, 4310 Fallbrook La., Dale City, Va. 22193

[ * ] Notice: This patent is subject to a terminal disclaimer.

[21] Appl. No.: 09/323,024

[22] Filed: Jun. 1, 1999

Related U.S. Application Data

[63] Continuation of application No. 07/829,314, Feb. 3, 1992, Pat. No. 5,908,043.

[51] Int. Cl.[7] .............................. E04H 15/58; E06B 7/00; H05K 9/00
[52] U.S. Cl. .................... 135/117; 49/475.1; 49/478.1; 361/816; 174/35 MS
[58] Field of Search ...................... 174/35 MS; 135/117, 135/156; 49/477.1, 478.1, 484.1; 361/816

[56] References Cited

U.S. PATENT DOCUMENTS

| | | |
|---|---|---|
| 2,757,225 | 7/1956 | Dunn . |
| 2,765,362 | 10/1956 | Lindgren . |
| 3,432,609 | 3/1969 | Duvall et al. . |
| 4,011,688 | 3/1977 | Geiss . |
| 4,077,418 | 3/1978 | Cohen . |
| 4,684,762 | 8/1987 | Gladfelter ............ 174/35 MS X |
| 4,785,136 | 11/1988 | Mollet et al. . |
| 5,017,736 | 5/1991 | Yarger et al. . |
| 5,545,844 | 8/1996 | Plummer et al. ............ 174/35 MS |
| 5,597,979 | 1/1997 | Courtney et al. ............ 174/35 MS |
| 5,908,043 | 6/1999 | Paes et al. ............ 135/139 |

FOREIGN PATENT DOCUMENTS 0 155 393   12/1984   European Pat. Off. .

*Primary Examiner*—Robert Canfield
*Attorney, Agent, or Firm*—Neil F. Markva

[57] ABSTRACT

This technical disclosure is for a structurally self-contained, RF-shielded enclosure which is rapidly deployable due to it's ultra light weight and ease of assembly. Assembled by one person in one half hour, the enclosure becomes an RF-shielded, free standing room within an existing non-secure room or environment. Lightweight metallized fabric is sewn together with rugged tent fabric and ballistics cloth. Fiberglass rods are connected to aluminum sleeves and unions to configure the room. A bulkhead assembly penetrates the side wall and provides filtered power and electronic signal interfaces. Honeycomb air guides and an electric fan facilitate air exchange within the room.

11 Claims, 6 Drawing Sheets

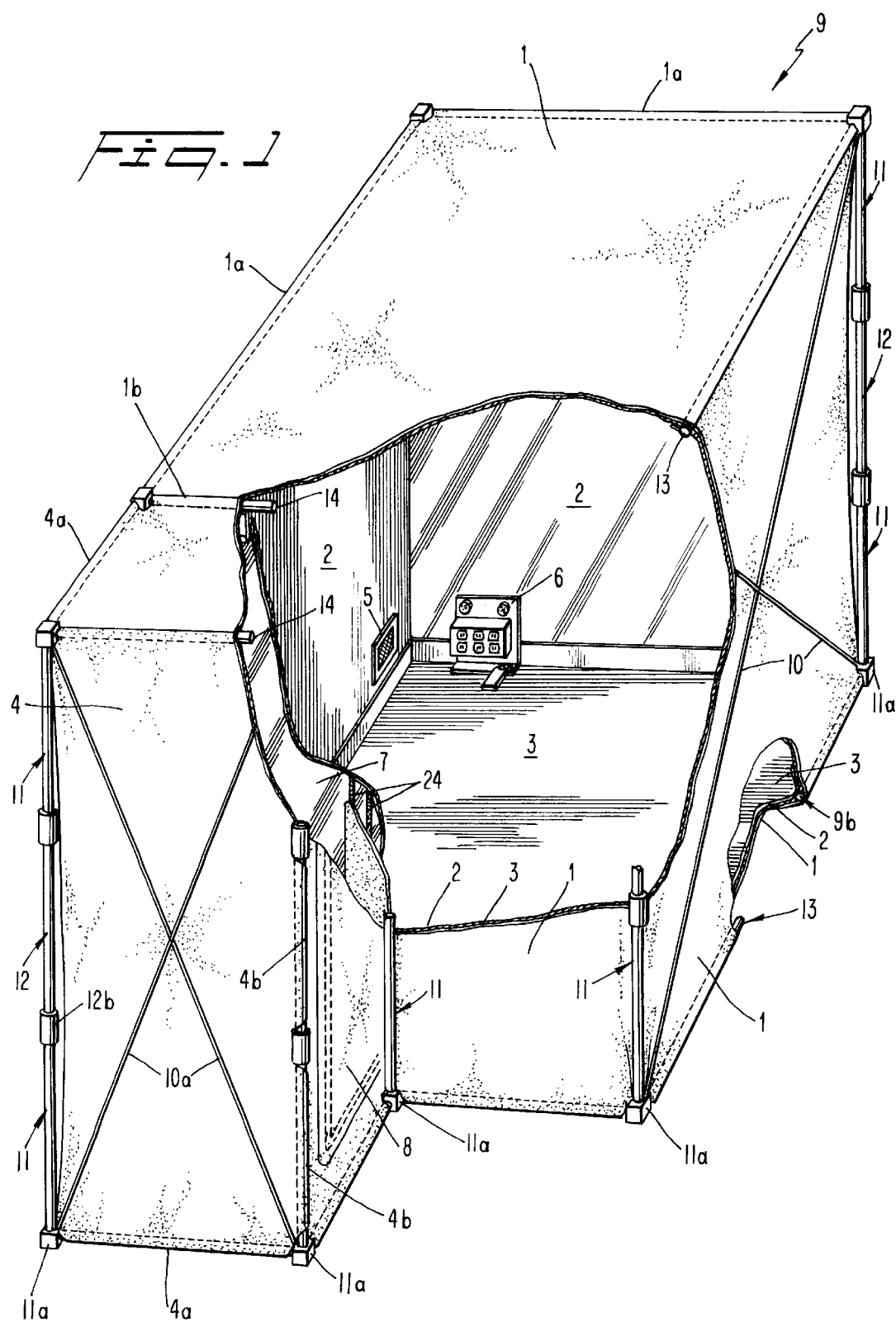

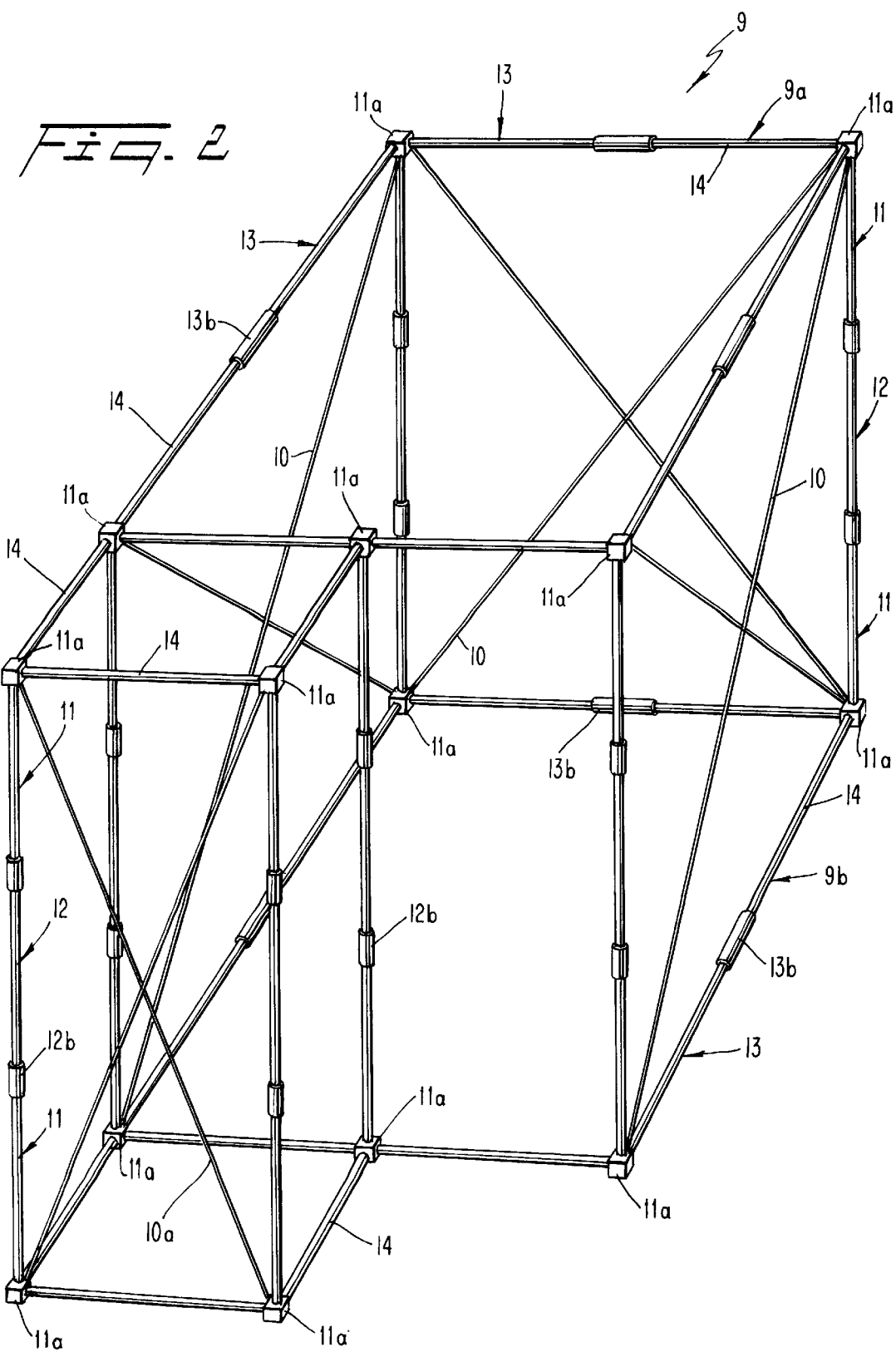

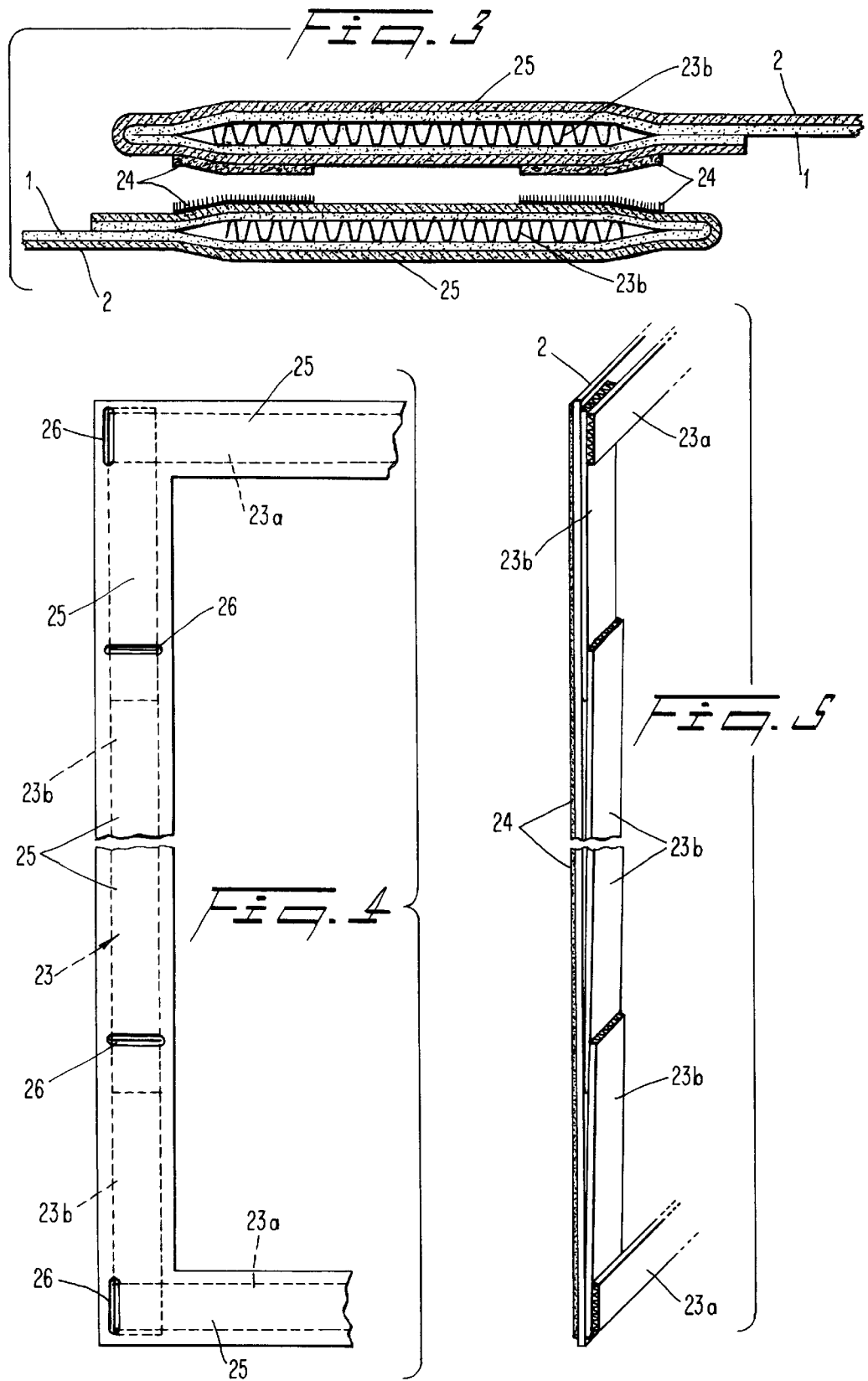

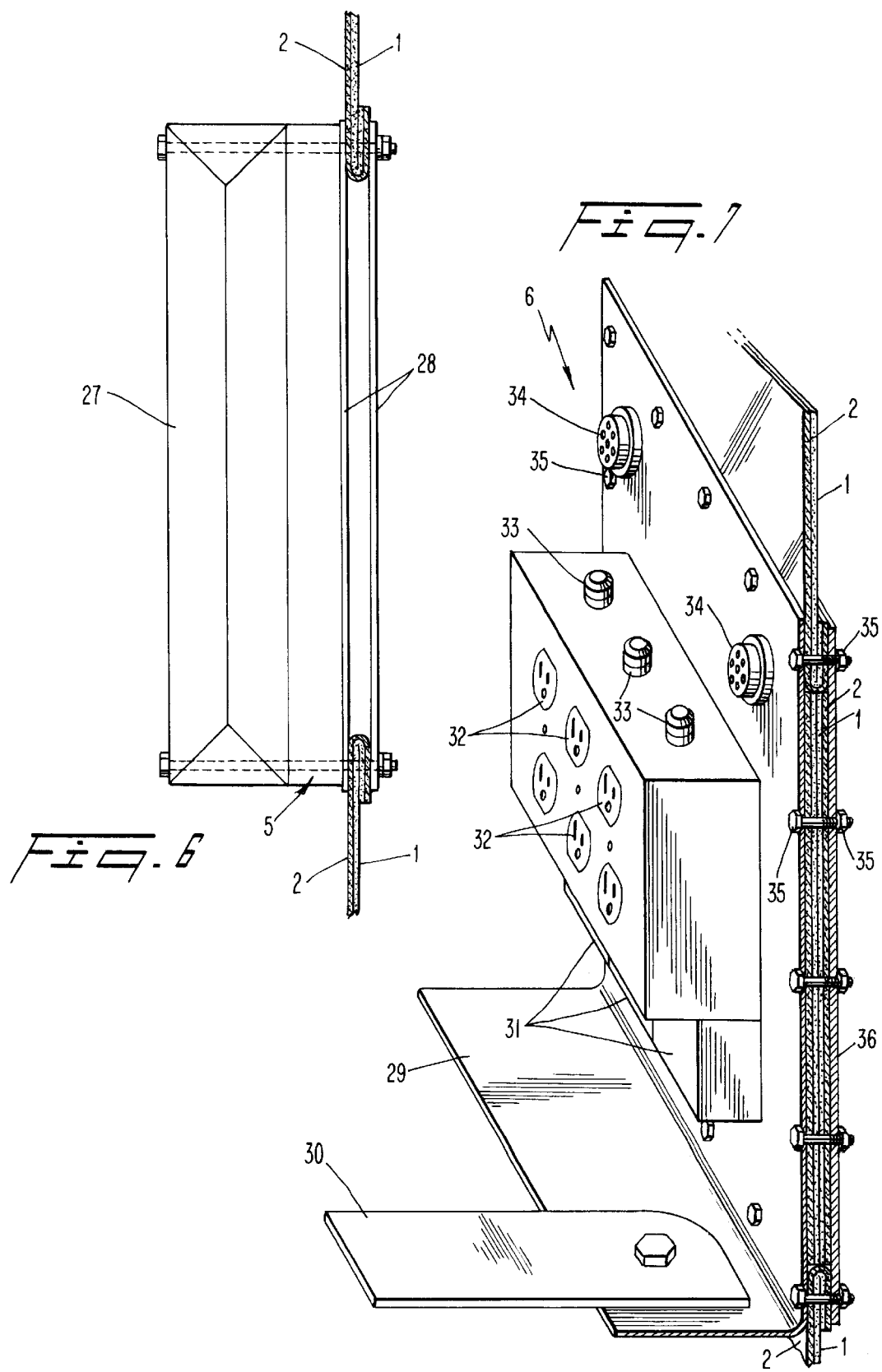

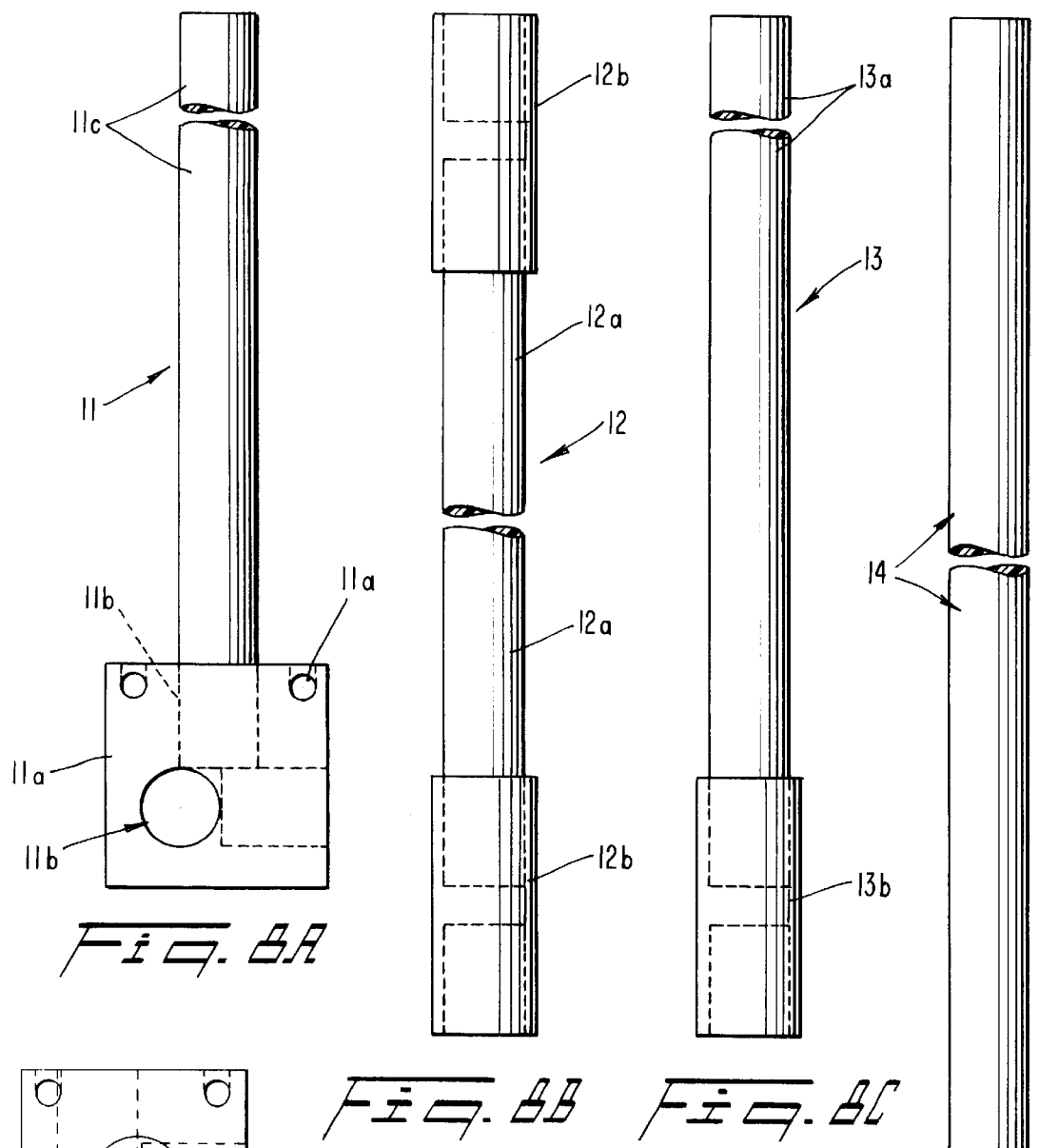
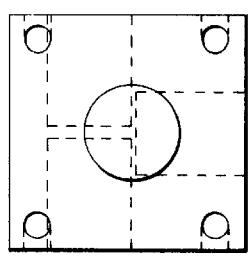
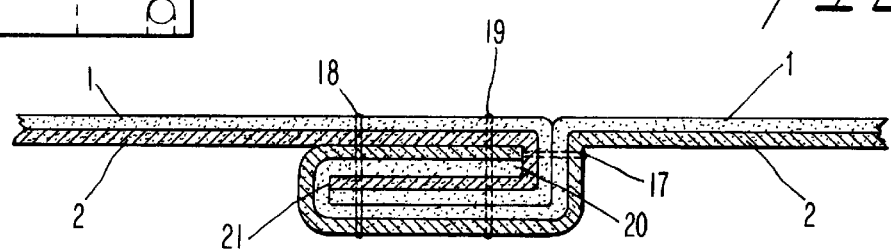

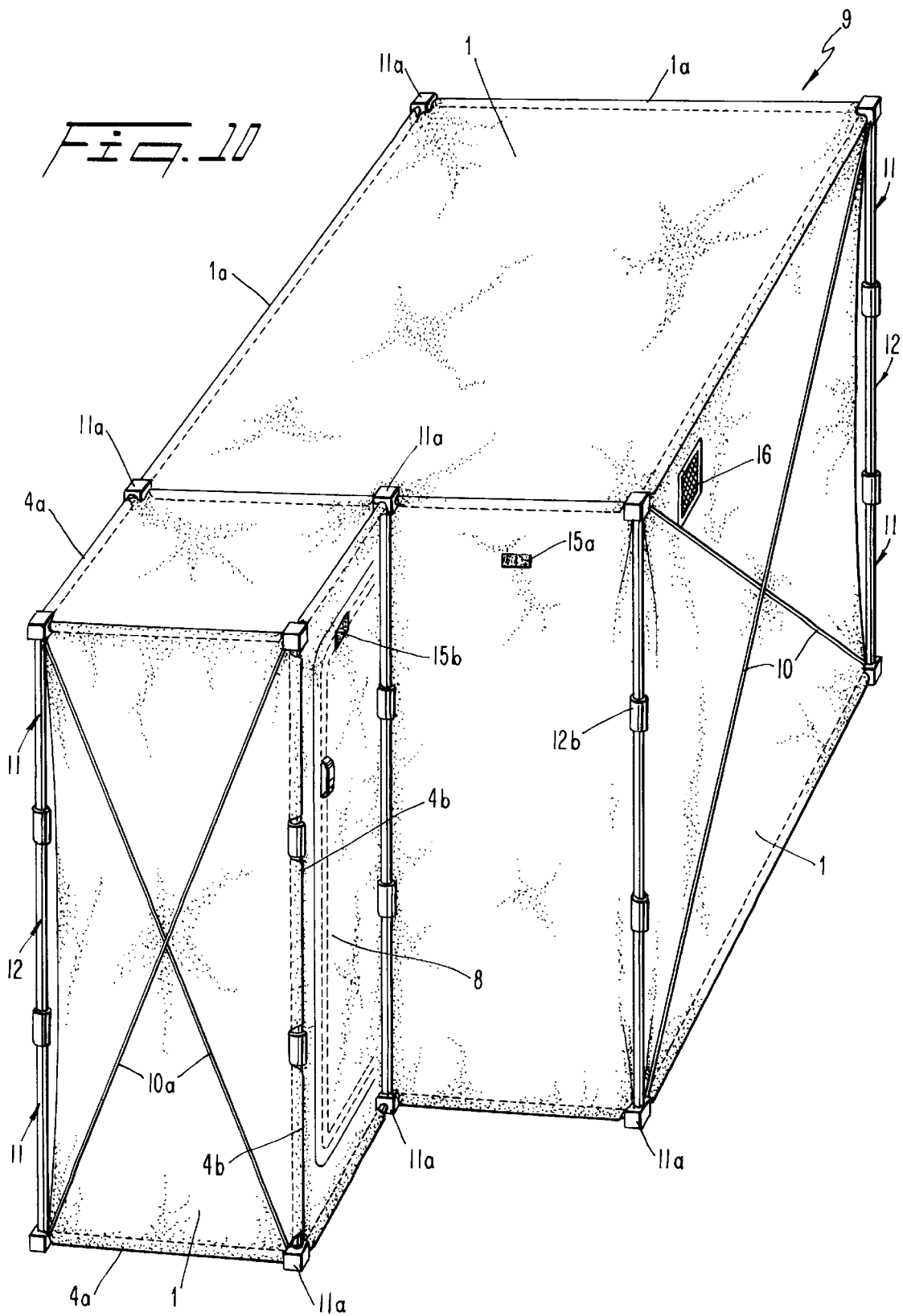

FREE-STANDING, PORTABLE TENT ASSEMBLY WITH FLEXIBLE, ELECTRONIC SIGNAL SHIELDED ENCLOSURE

RELATED APPLICATION

This is a continuation of U.S. application Ser. No. 07/829,314 filed Feb. 3, 1992 now U.S. Pat. No. 5,908,043.

FIELD OF THE INVENTION

This invention relates to a portable tent assembly that may be carried, assembled, and disassembled by one person. More particularly, the invention is directed to a portable tent assembly composed of a frame assembly and an enclosure of flexible material which blocks the passage of radio frequency (RF) transmission.

BACKGROUND OF THE INVENTION

The requirement for low-cost, portable and rapidly deployable shielded enclosures for temporary RF-secure electronic operations has long existed. During and immediately after fires, civil disturbances and natural disasters, the deployment or relocation of RF-secure electronic operations in a timely, efficient manner is often a critical part of the restoration to operational normalcy.

The objective of this invention relates to the use of shielded rooms or enclosures, shielded specifically against radio frequency interference. The invention addresses the aforementioned requirements for a cost-effective, ultralight, portable and rapidly deployable shielded enclosure for temporary, RF-secure electronic operations. The temporary requirement can exist because of the aforementioned emergency situations or, for a non-emergency, short-term requirement that does not warrant the expense of a permanent, shielded facility.

Although a handful of other devices are known, no other device meets the objectives of providing up to 60 decibels of attenuation across the preferred frequency range; and packaging as an ultralight portable, rapidly deployable, enclosure.

SUMMARY OF THE INVENTION

The portable tent assembly of this invention comprises a free-standing RF-shielded room or flexible enclosure which one person can assemble within thirty minutes as a shielded room within a larger existing room. The enclosure design provides maximum useable floor space with sufficient electrical power, air exchange, and RF protection for temporary, RF-secure electronic operations.

A specific embodiment of the flexible enclosure includes three types of fabric. The first fabric or inner cloth is a lightweight, woven or non-woven, metallized fabric consisting of any of the following combinations of metal coatings: copper, nickel, nickel-on-copper, tin-on-copper, or silver-on-copper. The second fabric or outer cloth is a lightweight, woven, # 400 Denier nylon, tent fabric. The third fabric or floor liner is a rugged, polypropylene fiber, ballistics fabric.

The inner and outer cloths are folded and sewn together using the French-fold method. The French-fold adds strength to the seam and provides electrical continuity of the inner cloth throughout the enclosure.

The enclosure includes two distinct floor space areas. A larger operations area or den is for equipment and personnel habitation. A smaller access area or foyer is a passageway for personnel to gain access to the larger area. The externally attached foyer reserves all floor space in the den for operational use and acts as an RF maze to provide RF-secure entry and departure to and from the den during (continual operation of the electronic equipment within the den.

Two uniquely-designed doors each incorporate two spaced strips of conductive Velcro sewn around the door edge and around the door frame to form an air gap therebetween. This radio frequency securing means produces a radio frequency-secure door opening when the door is in a closed position.

Rigid stabilizer members inserted into pockets sewn around the door and door frame provide a rigid surface for a positive seal between the frame and door. The stiffened door frame also provides support for the radio frequency securing means.

An external or outer frame assembly supports the flexible enclosure. The frame assembly comprises fiberglass rods inserted into aluminum sleeves which facilitate linear extension and connection between rods. Rod ends are inserted into milled, aluminum unions at all corners and junction points to facilitate the proper angular alignments needed to form the den and foyer.

The attachment of the outer cloth to the frame assembly is made by inserting all of the top and bottom horizontal rods through cloth conduits sewn onto the outer cloth around the top and bottom edges of the enclosure. Elastically stretchable shock cords are attached to and stretched between unions in an "X" pattern to add further stability to thus assembled structure.

In the preferred embodiment, the enclosure is constructed with penetrations for honeycomb air-guides and a fan to provide air exchange, and for a bulkhead assembly to provide filtered power and signal connectivity. All penetration hardware used in the enclosure including the honeycomb air-guides and bulkhead assembly is rated for the appropriate radio-frequency attenuation.

The transport and storage bags for the current invention are constructed of the same material as the floor liner. The bags stow all parts in pre-sized, pre-marked compartments for ease of identification and sequence of use during assembly.

The lightweight, durability of construction and the ease of assembly of the present invention will become more readily apparent from a consideration of the following drawings and description.

BRIEF DESCRIPTION OF THE DRAWINGS

Other objects of this invention will appear in the following description and appended claims, reference being made to the accompanying drawings forming a part of the specification wherein like reference characters designate corresponding parts in the several views.

FIG. 1 is a fragmentary perspective view of the fully-assembled enclosure and shows inner and outer cloths sewn together with the floor liner and supported by the external frame assembly.

FIG. 2 is a perspective view of the complete external frame assembly including the placement of shock cords.

FIG. 3 is a fragmentary cross-sectional view of the construction of a door and door-frame showing the inner and outer cloth (along with the two conductive Velcro strips and air gap), and placement of stabilizers within pockets sewn into the outer cloth.

FIG. 4 is a fragmentary elevational view showing stabilizer pockets sewn into the outer cloth around the door and door-frame and the access slots into which the stabilizers are inserted during assembly.

FIG. 5 is a fragmentary perspective view of the structure of FIG. 4 showing the relational position of the stabilizers around the doors and frames with the inner and outer cloth removed.

FIG. 6 is an elevational view, in partial section, of the honeycomb air guide and fan (attached to the enclosure wall), which details the mechanical and electrical continuity between the inner cloth and the metal frames.

FIG. 7 is a fragmentary perspective view of the bulkhead assembly (attached to the enclosure wall), detailing the mechanical and electrical continuity between the inner cloth, the bulkhead frame and the bulkhead panel.

FIGS. 8A, 8B, 8C, and 8D are elevational views of the four basic rod subassemblies used to configure the external frame assembly.

FIG. 9 is a cross-sectional view of the French fold seam used to connect the inner and outer cloths.

FIG. 10 is a perspective view of an assembled tent structure of the invention.

DETAILED DESCRIPTION

The entire shielded enclosure includes multiple "off the shelf" items. In FIG. 1, the shielded enclosure outer cloth 1 is a nylon tent material which covers and is sewn to an inner cloth 2 of metallized nylon ripstop fabric. Outer edges of outer cloth 1 and inner cloth 2 are folded and sewn together as shown in FIG. 9 to produce a French-fold seam. (Refer to FIG. 9).

The floor liner 3 covers the floor and lower edge of the inside wall with ballistics-cloth. The shielded enclosure includes a foyer or access area 4 with both an inner door 7 and outer door 8. Air flow is provided through honeycomb air guides 5. Electrical and signal entry and egress is through a bulkhead assembly 6.

The entire shielded enclosure is supported by a fiberglass and aluminum outer frame assembly 9, rigidized with six shock cords 10 on three sides and two shorter shock cords 10A on the front of the foyer area 4. As evidenced in this disclosure, shock cords 10 and 10A are composed of elastically stretchable material to stretch between opposing top and bottom corners of selected vertically disposed sides of the outer framework assembly as shown.

FIG. 2 shows a separable outer frame assembly 9 constructed of three specific types of rigid rod subassemblies and one length of fiberglass rod as shown in FIGS. 8A, 8B, 8C, and 8D. The first rod subassembly or union 11 includes a rigid rod coupling member that consists of a milled aluminum block 11a having four holes 11b which are drilled to accept insertion of three horizontal rigid rods and one vertical rod. A vertical rigid rod 11c is permanently inserted into a single vertical rod opening 11b to form union 11. Milled openings lid receive attachment of shock cords 10 or 10A depending on the location of the particular union 11 as shown in FIG. 2.

The second rod subassembly or vertical rod subassembly 12 shown in FIG. 8B consists of a fiberglass rod 12a permanently affixed to sleeve 12b at each end thereof. Vertical rod subassembly 12 is the center section of the seven vertical supports as shown in FIG. 2.

The third rod subassembly or horizontal rod subassembly 13 shown in FIG. 8C consists of a fiberglass rod 13a permanently affixed to aluminum sleeve 13b at one end thereof. Six horizontal rod assemblies are located on three frame side sections along the closed periphery of each top and bottom frame subassembly 9a and 9b, respectively.

As shown in the drawings and described herein, the separate rods are detachably and nonpivotally connected by the rod coupling members to form a frame structure having a plurality of vertically and horizontally rigid, nonpivotally connected rod members disposed to support the tent enclosure in an upright unfolded condition.

The length of fiberglass rod or tie rod 14 shown in FIG. 8D consists of a fiberglass rod with no permanent attachments. A tie rod 14 is inserted into unions 11 and vertical rod subassemblies 12 as required to construct the outer frame assembly 9.

In this specific embodiment, rods 11c, 12a, 13a, and 14 vary in length. The specific design of outer frame assembly 9 with frame subassemblies 9a and 9b includes fourteen unions 11, seven vertical rod assemblies 12, six horizontal rod assemblies 13, and sixteen tie rods 14.

As shown in FIG. 1, operations section 1 of the flexible enclosure includes outer sleeves 1a, 1b, 4a, and 4b at intersecting portions of the enclosure. Outer sleeves 1a, 1b, 4a, and 4b comprise rod holding means along corner or intersecting portions of the enclosure for removably locating at least one rigid member extending between two rigid coupling members as shown.

The outer frame assembly, as shown in the drawings, includes horizontally disposed and substantially identically shaped top and bottom frame subassemblies 9a and 9b, each defining a closed periphery. Each of the top and bottom frame subassemblies 9a and 9b include at least one rod member extending between rod coupling members as shown. Thus, the closed periphery includes a plurality of frame side sections each having outer ends and an end rod coupling member located at each said outer end thereof as illustrated.

In this embodiment, rod subassemblies 11, 12, and 13, shown in FIGS. 8A, 8B, 8C, and 8D, comprise a rod fixedly attached to a rod coupling member. Rods 14 are removably connected to coupling members as are the free ends of rods 11c, 12a, and 13a that are not fixed to a coupling member.

As shown assembled, vertically disposed rod members are connected to corresponding end rod or corner coupling members 11a at the outer ends of each frame side section when the top and bottom frame subassemblies 9a and 9b are registered with respect to each other.

As evidenced by the drawings, the vertically disposed rod members with the horizontally disposed and registered top and bottom frame subassemblies 9a and 9b define a plurality of vertically disposed profiles each having two upper end joints and two lower end joints. In this specific embodiment, the vertically disposed profiles are rectangular and each have two upper corners and two lower corners.

As seen assembled in FIGS. 1 and 2, elastic cord members 10 and 10a are removably connected to and stretched between opposing top and bottom joints of selected vertically disposed profiles. In this specific embodiment, rod subassemblies 11, 12, and 13, and rods 14 are straight and form vertically disposed rectangular profiles having two upper corners and two lower corners. Thus, cord members 10 and 10a are connected to and stretched diagonally between opposing top and bottom corners to form an X across the rectangular profile as shown. In this embodiment, coupling members in rod subassembly 11 includes holes 11d milled into each corner thereof as shown in FIG. 8A.

When mounted to the outer frame assembly 9, the shielded enclosure forms an operations chamber and an access chamber into which a person must enter through openings or doors 7 and 8 shown located in the enclosure side wall portion. The ingress and egress doors 7 and 8 are each located within a vertically disposed profile of the outer frame assembly 9 that has no cord members 10 stretched between its opposing top and bottom corners.

As disclosed herein, the flexible enclosures and outer frame assembly have a combined weight effective to allow one adult person to carry the tent assembly when disassembled. The flexible enclosure and outer frame assembly rod member, coupling members, and cord members have a size effective so that only one adult person may erect the tent assembly.

The fourteen first rod subassemblies or unions 11 are all identical and interchangeable as, top or bottom, corner or "T" unions. The seven vertical rod subassemblies 12, as shown, tie the top and bottom unions 11 together at each vertical support position. In this embodiment, there are six horizontal rod subassemblies 13 and sixteen tie rods 14.

One horizontal rod subassembly 13 and one tie rod 14 are fitted together and inserted into rod holding sleeves 1a and slip fit into each top and bottom union 11 on three sides of the enclosure den area (as shown in FIG. 2). The remaining tie rods 14 are inserted into rod holding sleeves 4a and 1b and fitted horizontally into the top and bottom unions 11 at the foyer end of the den or operations area 1 and around the foyer or access area 4 to complete the outer frame assembly 9.

The six long elastic shock cords 10 are installed in an "X" configuration as shown in FIG. 2 on three sides of the den portion of the frame assembly 9 and the two short records 10A are placed on the front of the foyer area 4.

FIG. 3 shows corrugated plastic flat stork as stabilizers 23 or both inner door 7 and outer door 8 and their respective frames. Two conductive, spaced pairs of VELCRO strips 24 are disposed along the edge of the door frame structure and door edges to produce a radio frequency-secure door opening when the door is in a closed position. In other words, because radio-frequency signals are electronic signals, the door frame structure includes electronic signal-securing means to prevent electronic signal transmission into and out of the flexible enclosure along an outer edge of the door member when the door member is in a closed position. Thus, VELCRO strips 34 produce an electronic signal-securing opening means when the door member is in a closed position. In this embodiment, the door frame structure and door edges overlap as shown.

FIG. 5 shows stabilizers 23 inserted into pockets 25 sewn into outer cloth 1 to make the frames of doors 7 and 8 more rigid and to assure positive contact of the conductive VELCRO strips 24 sewn onto mating surfaces of the inner cloth 2. VELCRO is a registered trademark as applied to hook and loop-type separable fasteners and is owned by Velcro Industries B.V.

FIG. 4 shows three vertical and two horizontal pockets 25 sewn around the frame of each door 7 and 8 with access slots 26 for insertion and removal of the stabilizers 23.

FIG. 5 depicts how the stabilizers 23 overlap when inserted into the pockets 25 providing rigidity to doors 7 and 8 and their respective frames. In this embodiment, the horizontally disposed stabilizers 23a overlap the vertical stabilizers 23b four inches and vertical stabilizers 23b overlap each other six inches.

FIG. 6 shows the honeycomb air-guide 5 and the attached fan 27 constitutes blowing means which provides air assistance during assembly of the shielded enclosure and, together with air exhaust outlet 16, air exchange during actual operations.

The fan 27 and honeycomb air guide 5 are bolted together and attached to a frame 28. The frame 28 is permanently affixed to the shielded enclosure wall with the inner cloth 2 having a metal coating that makes full contact with the frame 28. The second honeycomb air-guide 5 (or exhaust), (not shown), is treated identically to the intake air-guide except that there is no fan. Because the enclosure structure precludes transmission of electronic radio-frequency signals, honeycomb air-guide 5 necessarily includes means for attenuating electronic radio-frequency signals through the air intake and exhaust openings.

FIG. 7 shows the mechanical layout and identification of the bulkhead assembly components. A composite of the electrical and signal bulkhead assembly 6 includes an "L" shaped panel 29 with a ninety degree "swing" foot 30 for stabilization. The bulkhead panel 29 houses three RF filters 31, three duplex receptacles 32, and three in-line fuse or circuit breaker assemblies 33 to provide three separate, twenty-ampere, RF-protected, electrical circuits. The three RF filters constitute an electronic signal interference filter.

In addition, the bulkhead panel 29 houses two fiber optic guides 34 for signal entry and egress therefore constituting means for electronically connecting bulkhead panel 29 to a source of externally disposed electrical power. The bulkhead assembly 6 is affixed to the enclosure wall with captive screws 35 entering a frame 36 which is permanently attached to the inner cloth 2. Other entry/egress connectors and methods for electrically connecting bulkhead panel 29 to a source of externally disposed electrically power will be affixed to the bulkhead panel 29 as requirements dictate.

FIG. 9 shows the edges 20 and 21 of layered outer cloth 1 and inner cloth 2 overlapped and folded as shown. The overlapped and folded fabric edges 20 are sewn along locations 17, 18, and 19 as shown. The French-fold seam assures inner cloth electrical continuity throughout the enclosure.

FIG. 10 shows the outside dimensions of the assembled tent structure disclosing the air exhaust outlet 16, and VELCRO strips 15a and 15b used to hold door 8 open as needed. These parts were in the cut away portion as shown in FIG. 1.

The foregoing disclosure and description of the invention are illustrative and explanatory thereof, and various changes in size, shape and materials as well as in the details of the illustrated construction may be made without departing from the spirit of the invention.

What is claimed in the preferred embodiment is:

1. A free-standing portable tent assembly for providing a shielded environment for operating electronic equipment, said assembly comprising:
   a) collapsible flexible enclosure means and rigid frame assembly support means for maintaining said collapsible flexible enclosure means in an upright position to define an enclosed operations area sufficient to contain said equipment for effecting electronic operations;
   b) said flexible enclosure means including a top ceiling portion, a bottom floor portion, and a side wall portion fixedly connected along a top edge to the top ceiling portion, and fixedly connected along a bottom edge to the bottom floor portion;
   c) said flexible enclosure means is composed of flexible sheet material having structural characteristic means that precludes transmission of electronic signals therethrough to provide electronic shielding for equipment within the enclosed operations area;

d) said side wall portion being composed of flexible material and including an electronic signal-secure ingress and egress opening means for moving said electronic equipment into and out of said enclosed operations area within the flexible enclosure means when the flexible enclosure means is in said upright position;

e) the side wall portion including an electronic signal-secure door member composed of flexible material and pivotally movable along one side thereof between a closed position and an open position and door frame structure means for providing stability along an edge portion of the opening means to support the door member in a closed position with respect to the opening means, and f) said door frame structure means including electronic signal-securing means to prevent electronic signal transmission into or out of the flexible enclosure means along an outer edge of the door member and the adjacent edge portion of the opening means when the door member is in a closed position with respect to the opening means, g) the electronic signal-securing means including conductive, separable hook and loop fastener means disposed along said outer edge of the door member and said edge portion of the opening means to produce an electronic signal-secure opening means when the door member is in a closed position.

2. A free-standing portable tent assembly for providing a shielded environment for operating electronic equipment, said assembly comprising:

a) collapsible flexible enclosure means and rigid frame assembly support means for maintaining said collapsible flexible enclosure means in an upright position to define an enclosed operations area sufficient to contain said equipment for effecting electronic operations;

b) said flexible enclosure means including a top ceiling portion, a bottom floor portion, and a side wall portion fixedly connected along a top edge to the top ceiling portion, and fixedly connected along a bottom edge to the bottom floor portion;

c) said flexible enclosure means is composed of flexible sheet material having structural characteristic means that precludes transmission of electronic signals therethrough to provide electronic shielding for equipment within the enclosed operations area;

d) said side wall portion being composed of flexible material and including an electronic signal-secure ingress and egress opening means for moving said electronic equipment into and out of said enclosed operations area within the flexible enclosure means when the flexible enclosure means is in said upright position;

e) the side wall portion including an electronic signal-secure door member composed of flexible material and pivotally movable along one side thereof between a closed position and an open position and door frame structure means for providing stability along an edge portion of the opening means to support the door member in a closed position with respect to the opening means, and f) said door frame structure means including electronic signal-securing means to prevent electronic signal transmission into or out of the flexible enclosure means along an outer edge of the door member and the adjacent edge portion of the opening means when the door member is in a closed position with respect to the opening means.

3. A tent assembly as defined in claim 1 wherein the electronic signal-securing means includes two conductive, spaced pairs of separable hook and loop fastener strips disposed along the door frame structure means and edge portion of the opening means to produce an electronic signal-secure opening means when the door member is in a closed position.

4. A tent assembly as defined in claim 2 or 1 wherein said electronic signals include radio-frequency signals, and said flexible sheet material is effective to preclude transmission of said radio-frequency signals to provide radio-frequency shielding for equipment within the enclosed operations area.

5. A tent assembly as defined in claim 2 or 1 wherein said door frame structure means includes pocket means disposed along the edge of the door opening means, and rigid stabilizer means removably disposed within the pocket means to stiffen the edge portion of the door opening means for receiving the door in a closed condition and for providing support for the electronic signal-securing means.

6. A tent assembly as defined in claim 5, wherein said pocket means includes a plurality of elongated pocket members and the stabilizer means includes a plurality of rigid stabilizer members each having a structural configuration effective to be inserted into an elongated pocket member.

7. A tent assembly as defined in claim 2 or 1 wherein said flexible enclosure means is foldable and includes an air intake opening, an air exhaust opening, and fixedly mounted electrical power bulkhead panel means constituting penetration hardware rated for appropriate electronic signal attenuation.

8. A tent assembly as defined in claim 7 wherein the air intake opening and air exhaust opening are each defined within a rigid frame structure mounted to a honeycomb air guide, said air intake opening includes blowing means attached to blow air through the honeycomb air guide into the enclosure whereby said blowing means provides an air assist during the initial assembly of the frame and enclosure, and air exchange during occupancy of the enclosure.

9. A tent assembly as defined in claim 7 wherein said bulkhead panel means is mounted to a frame structure fixedly connected to the side wall portion adjacent the bottom floor portion, said bulkhead panel means including means for stabilizing the panel in an upright position.

10. A tent assembly as defined in claim 9 wherein said means for stabilizing said bulkhead panel means includes a pivotally mounted foot member for extending outwardly from the bulkhead panel means onto the bottom floor portion.

11. A tent assembly as defined in claim 9 wherein said electronic signals include radio-frequency signals, and said bulkhead panel means includes a radio-frequency filter, an electrical outlet receptacle, a circuit breaker assembly, and fiber optic means for signal entry and egress.

\* \* \* \* \*